(12) United States Patent
Hurwitz et al.

(10) Patent No.: US 8,711,951 B2
(45) Date of Patent: Apr. 29, 2014

(54) POWERLINE COMMUNICATION DEVICE WITH LOAD CHARACTERIZATION FUNCTIONALITY

(75) Inventors: Jonathan Ephraim David Hurwitz, Edinburgh (GB); Seyed A A Danesh, Edinburgh (GB); Juan Carlos Riveiro Insua, Valencia (ES)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/436,170

(22) Filed: Mar. 30, 2012

(65) Prior Publication Data

US 2013/0003878 A1 Jan. 3, 2013

Related U.S. Application Data

(60) Provisional application No. 61/503,060, filed on Jun. 30, 2011.

(51) Int. Cl.
*H04B 3/00* (2006.01)

(52) U.S. Cl.
USPC ............... 375/257; 340/12.32; 340/13.23; 340/538; 455/41.1; 455/402

(58) Field of Classification Search
None
See application file for complete search history.

(56) References Cited

U.S. PATENT DOCUMENTS

| | | | |
|---|---|---|---|
| 8,422,958 B2* | 4/2013 | Du | 455/63.1 |
| 2005/0085259 A1* | 4/2005 | Conner et al. | 455/552.1 |
| 2011/0130887 A1* | 6/2011 | Ehlers, Sr. | 700/296 |
| 2011/0193417 A1* | 8/2011 | Hirasaka et al. | 307/104 |
| 2012/0231734 A1* | 9/2012 | Symons et al. | 455/41.1 |
| 2013/0057389 A1* | 3/2013 | Balgard et al. | 340/10.1 |

* cited by examiner

*Primary Examiner* — Adolf Dsouza
(74) *Attorney, Agent, or Firm* — Garlick & Markison; Bruce E. Garlick

(57) ABSTRACT

A method for operating a Power Line Communications (PLC) device includes identifying at least one proximately located load device using the wireless interface, determining device characteristics of the at least one proximately located load device using the wireless interface, communicating with a remote PLC device via the PLC interface, and transmitting to the remote PLC device via the PLC interface the device characteristics of the at least one proximately located load device. Operation may further include establishing wireless communications with the at least one proximately located device, querying the at least one proximately located device wirelessly, and receiving the device characteristics wirelessly. Other operations include creating a diagrammatic representation of a premises representing a plurality of areas and passages between the plurality of areas and including wireless reception quality for each of the plurality of spaces.

20 Claims, 16 Drawing Sheets

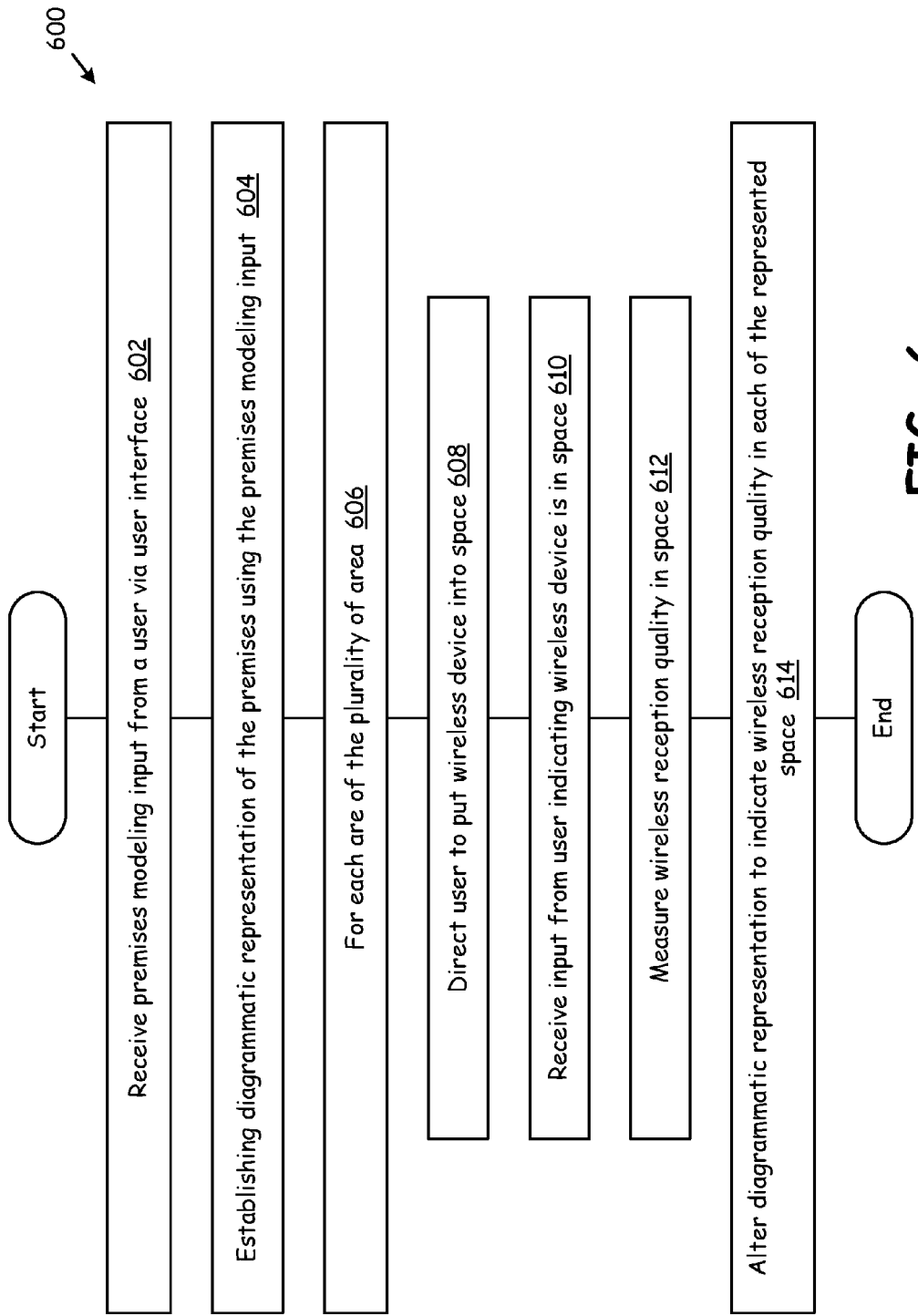

| Phase 1 | Phase 2 | Phase 3 |
|---|---|---|
| Capturing the map | Applications at the handheld device | Moving model to a smart router |
| This phase has 3 stages itself, the stages to capture a simple map of the home primarily based around the interface of a smart handheld device. This should take 10 - 15 minutes | After the map and coverage is captured, many applications can be implemented on the smart device to use this information to solve wireless coverage problems, etc. | Once users choose to upgrade their router to a smart router, the information is transferred to the smart router, and the smart router becomes the front end to manage resources within the home |

FIG. 8

POWERLINE COMMUNICATION DEVICE WITH LOAD CHARACTERIZATION FUNCTIONALITY

CROSS-REFERENCE TO PRIORITY APPLICATION

This application claims priority under 35 U.S.C. §119(e) to U.S. Provisional Application Ser. No. 61/503,060 filed Jun. 30, 2011, which is incorporated herein by reference in its entirety.

BACKGROUND OF THE INVENTION

1. Field of the Invention

The present invention relates to powerline communications and in particular, powerline communication devices, and systems of use therefore.

2. Description of the Related Art

With the growing need for the exchange of digital content (e.g. MP3 audio, MPEG4 video and digital photographs) there is a widely recognized need to improve digital communication systems. Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs.

Communications within a household or within other premises may also be serviced by a Wireless Local Area Network (WLAN), a cellular network, millimeter wave communications, e.g., 60 GHz, Wireless Personal Area Network (WPAN), Cable Modem Network, Local Area Network (LAN), and other communication techniques. Each of these communication types has its respective benefits and shortcomings. None of these communication types is typically able to provide a full coverage solution within the household (or other premises). The shortcoming of all wired technologies is the lack of mobility thereof. Shortcomings of all wireless technologies are coverage holes, which are typical, interference from other wireless devices, including competing wireless devices, Radar, etc., and bandwidth limitations.

BRIEF DESCRIPTION OF THE DRAWINGS

FIG. 6 is a flowchart illustrating operations for creating a diagrammatic representation of a premises according to one or more embodiments of the present invention;

FIG. 8 is a block diagram illustrating operations for creating a diagrammatic representation of a premises according to one or more embodiments of the present invention.

DETAILED DESCRIPTION

Figure 1:
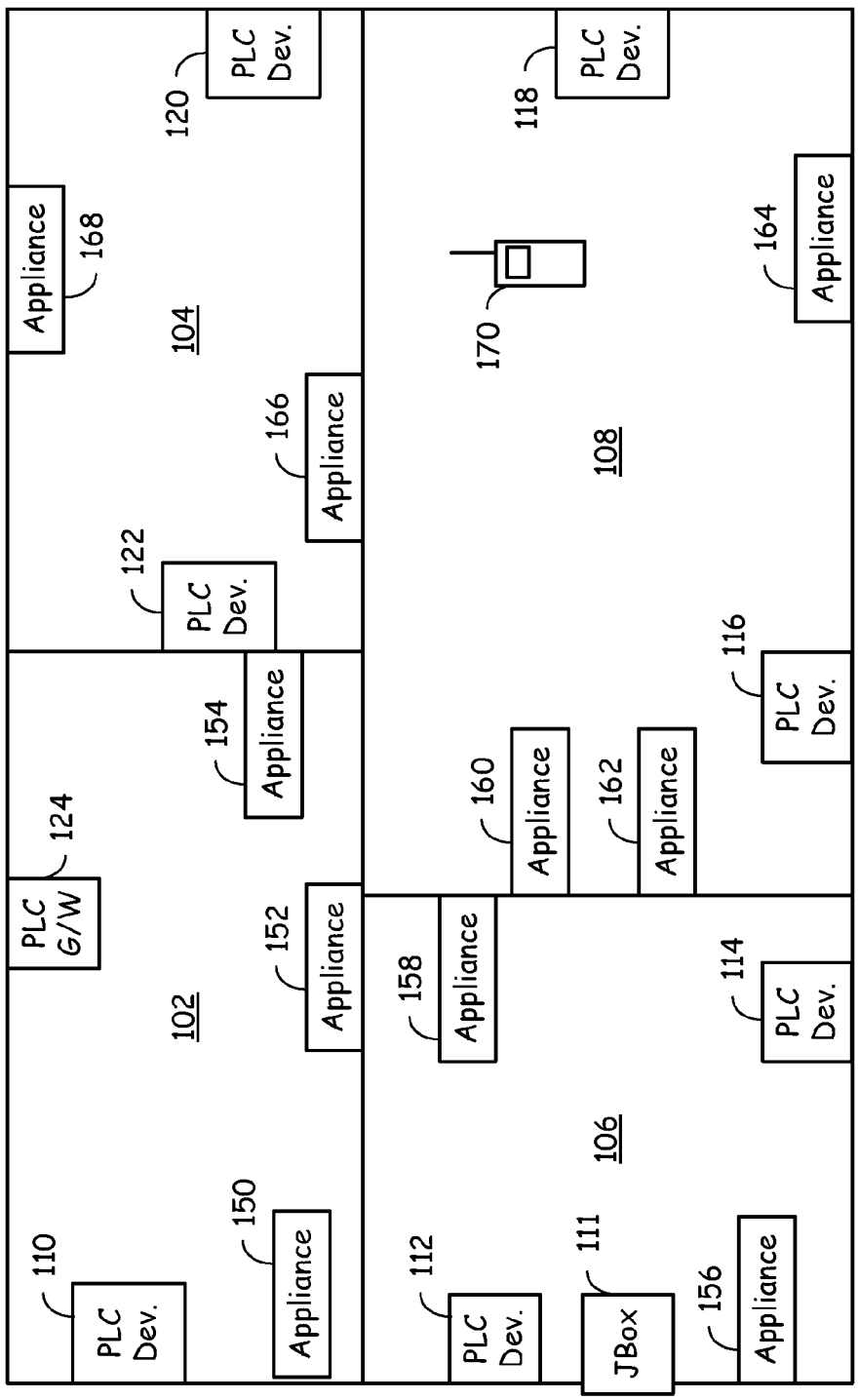
FIG. 1 is a system diagram illustrating a premises in which at least one Powerline Communication (PLC) device resides that operates according to one or more embodiments of the present invention.

FIG. 1 is a system diagram illustrating a premises in which at least one Powerline Communication (PLC) device resides that operates according to one or more embodiments of the present invention. The premises 100 has a distributed mains wiring system (not shown) consisting of one or more ring mains, several stubs and some distribution back to a junction box 111. In other constructs the distributed mains wiring system has a breaker box with circuits routed there from in a star configuration. For the sake of example, the premises 100 has four areas 102, 104, 106, and 108, e.g., rooms. Each room 102, 104, 106, and 108 may have a different number of outlets and other power mains connections. Accordingly, there are a variety of distances and paths between different power outlets in the household 100. In particular, the outlets most closely located to each other are those on multi-plug strips, and the outlets furthest away from each other are those on the ends of stubs of different ring mains (e.g. power outlets in the garden shed and the attic). The majority of outlets associated with a particular application (e.g. Home Cinema) are normally located relatively close together.

Installed within the premises 100 are a plurality of PLC devices 110, 112, 114, 116, 118, 120, and 122. Also installed in the premises is a PLC device serving as a Gateway 124 for communications services. Each of the PLC devices 110-122 illustrated has a structure same or similar to the structure described with reference to FIG. 2 and that operates according to the operations described with reference to FIGS. 3 and 4.

Also located in the premises 100 are a number of appliances 150, 152, 154, 156, 158, 160, 162, 164, 166, and 168. These appliances may be kitchen appliances such as refrigerators, freezers, stoves, ovens, dishwashers, trash compactors, small appliances, ice makers, etc. Further, these appliances may be office appliances such as computers, printers, scanners, monitors, etc. Further still these appliances could be industrial equipment, air conditioning units, heating units, ventilation units, fans, etc. The scope of the term appliance is not limited by the examples provided herein.

According to one aspect of the present invention, one or more of the PLC devices in the premises 100 is capable of providing network service to the appliances along with node tagging support. One or more of the illustrated PLC devices has the ability to identify proximately located appliances (devices) using Near Field Communications, RFID reading, and/or bar code reading. One or more of the appliances may have a conventional tag, e.g., an RFID, Near Field Communication (NFC) tag, one dimensional or two dimensional bar code, or another type of tag. Further, NFCs may be employed by the device to communicate with and identify proximately located appliances. With each device labeled or identified, this information may be uploaded to a central location to at least logically map the relative locations of these devices with reference to the PLC devices identifying the loads.

This type of technique could be used to support "network in a box" functionality within a home or business. This network in a box may include RF tags for network enabled devices in the home (or simply load devices). This invention may also be extended with the use of wireless beam forming to further identify a fixed physical location of the devices with respect to other devices. By using wireless beam forming, the logical locations of each of the devices may be related to one another and the physical positioning of the beam forming technique.

According to a multi-communication technique installation within a home, one type of communication service may be wireless communications that are serviced by devices that bridge from a powerline communications communication link to a wireless link. For example, this type of device may provide 60 GHz wireless communications within a particular room. Further, another type of device may provide 802.11 communications with a particular part of the structure. Further, another bridging type device may bridge between PLC and Ethernet communications.

According to another aspect of the present invention, a software application is downloaded onto a portable electronic device 170, e.g., smart phone, laptop computer, tablet computer, etc., for use in mapping wireless services available within a home. The phone 170 would have at least one wireless interface servicing WLAN or 60 GHz that would be able to determine wireless service quality, e.g., WLAN, WPAN, 60 GHz service in all portions of the home/structure. The phone 170 may have a GPS receiver or another type of mapping location awareness that is employed for characterizing available communication services within the home. RFID/NFC tags associated with either or both the phone/tablet and a particular access point (powerline or otherwise) could interact along with position information to assist in generating such map. As described further with reference to FIGS. 6-15, a user interface of the phone 170 allows a user to create a diagrammatic representation of the premises 100. A user enables the application to do a walkabout within the home to characterize wireless communication characteristics within various portions within the home. The data collected by the phone 170 may be subsequently used to determine where additional points of communications are required, e.g. additional PLC/802.11 or PLC/60 GHz devices are required. Further, this data may be downloaded to a central location such as a router/system management entity within the premises.

Figure 2:
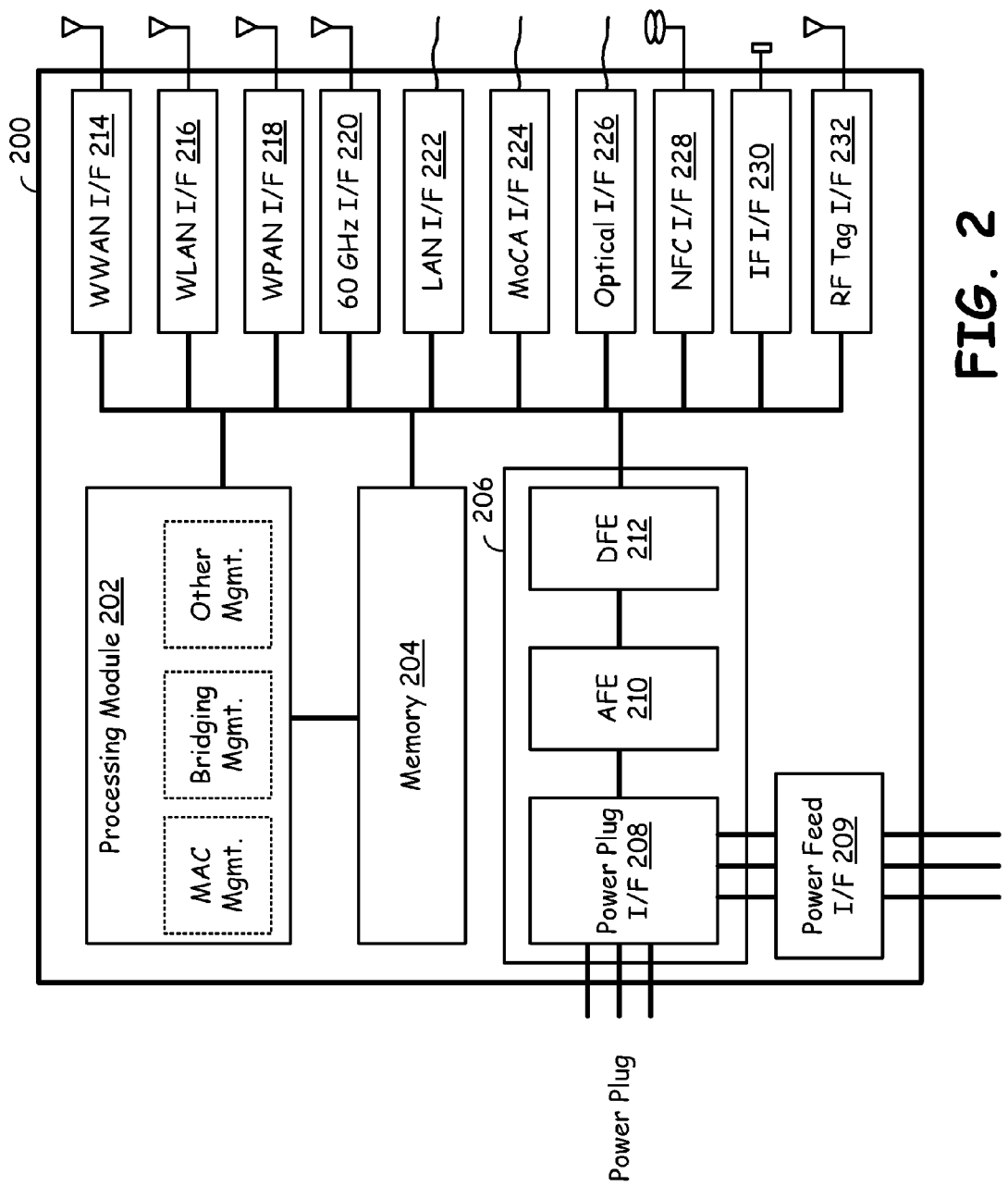
FIG. 2 is a block diagram illustrating a PLC device constructed according to one or more embodiments of the present invention.

FIG. 2 is a block diagram illustrating a PLC device constructed according to one or more embodiments of the present invention. The PLC device 200 supports PLC operations according to one or more PLC communication standards. The PLC device 200 may be coupled to a power plug, e.g., into a wall plug. The PLC device 200 may further include a power feed I/F 209 to provide switchable power to a coupled load device, e.g., appliance. In some embodiments, the PLC device 200 may be permanently installed within a home or other premises.

The PLC device 200 includes a PLC interface 206 that includes a power plug interface 208, an Analog Front End (AFE) 210, and a Digital Front End (DFE) 212. Generally the AFE 210 includes analog signal processing elements while the DFE 212 includes digital signal processing elements. At least one Analog to Digital Converter (ADC) and at least one Digital to Analog Converter (DAC) service analog to digital and digital to analog signal conversion operations, respectively. Various components of the PLC interface 206 as they relate to embodiments of the present invention will be described further herein.

The PLC device 200 also includes one or more other communication interfaces, including a Wireless Wide Area Network (WWAN) interface 214, e.g., a WiMAX interface, a Wireless Local Area Network (WLAN) interface 216, e.g., an 802.11x interface, a Wireless Personal Area Network (WPAN) interface 218, e.g., a Bluetooth interface, a 60 GHz interface 220 (millimeter wave interface), a Local Area Network (LAN) interface 222, e.g., an Ethernet interface, a cable interface, e.g. Multimedia over Coax Alliance (MoCA) interface 224, an optical interface 226, a Near Field Communication (NFC) I/F 228, an Infra-Red I/F 230, and/or an RF Tag I/F 232. The user should appreciate that the PLC device 200 may bridge communications between a power plug and one or more devices, e.g., between the power plug and a desktop computer, a laptop computer, a touchpad computer, an appliance, a television, another entertainment system device, etc., via the PLC interface 206 and one or more of the other communication interfaces 214, 216, 218, 220, 222, 224, 226, 228, 230, and/or 232.

The processing module 202 may include one or more of a system processor, a digital signal processor, a processing module, dedicated hardware, an application specific integrated circuit (ASIC), or other circuitry that is capable of executing software instructions and for processing data. In particular, the processing module 202 is operable to support Medium Access Control (MAC) management, communications bridging management, and other management of the communications circuitry of the PLC device 200. The memory 204 may be RAM, ROM, FLASH RAM, FLASH ROM, optical memory, magnetic memory, or other types of memory that is capable of storing data and/or instructions and allowing processing circuitry to access same. The processing module 202 and the memory 204 supports operations of embodiments of the present invention as further described herein. These operations may be embodied in software instructions stored in the memory 204 and executed by the processing module 202.

Figure 3:
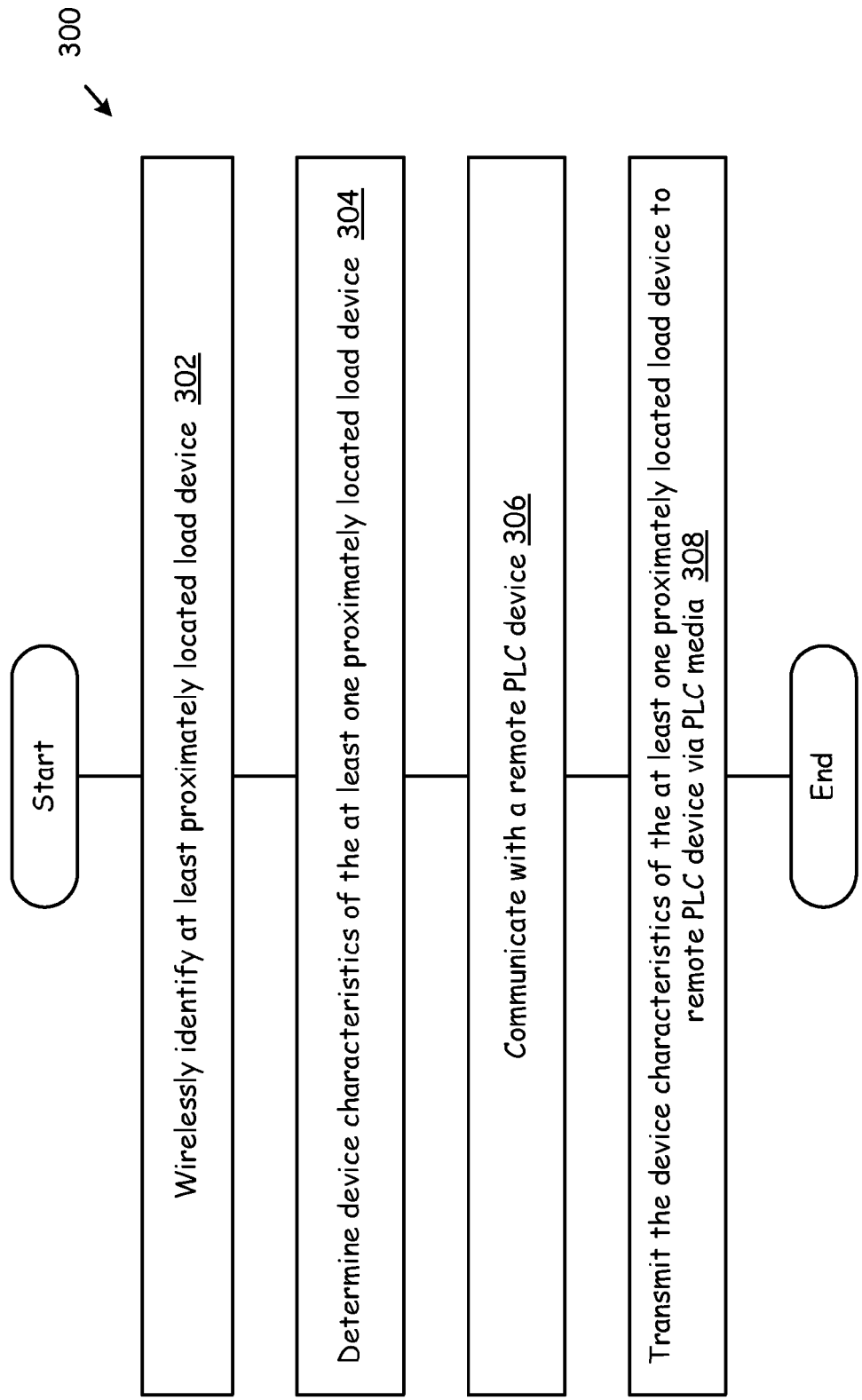
FIG. 3 is a flow chart illustrating a method for operating a PLC device according to one or more embodiments of the present invention.

FIG. 3 is a flow chart illustrating a method for operating a PLC device according to one or more embodiments of the present invention. The operations 300 of FIG. 3 may be performed by any of the various PLC devices illustrated in FIG. 1. Further, the PLC device performing the operations 300 of FIG. 3 may have the structure, or similar structure to the PLC device 200 illustrated in FIG. 2. The operations 300 of FIG. 3 begin with a Power Line Communications (PLC) device identifying at least one proximately located load device using its wireless interface (Step 302). Operations 300 continue with the PLC device determining device characteristics of the at least one proximately located load device using the wireless interface (Step 304). Then, the PLC device communicates with a remote PLC device via its PLC interface (Step 306). Operations conclude with the PLC device transmitting to the remote PLC device via the PLC interface the device characteristics of the at least one proximately located load device (Step 308).

The operations 300 of FIG. 3 may be performed for a plurality of proximately located load devices, e.g., appliances 150, 152, and 154 proximate to PLC device 110 of FIG. 1. In identifying the at least one proximately located load device using the wireless interface at Step 302, the PLC may perform RF tag reading of an RF tag of the at least one proximately located load device, use Near Field Communications (NFCs) to communicate with the at least one proximately located load device, and/or use Wireless Personal Area Network (WPAN) communications to communicate with the at least one proximately located load device, among other wireless operations.

In determining device characteristics of the at least one proximately located device using the wireless interface at Step 304, the PLC device may establish wireless communications with the at least one proximately located device, query the at least one proximately located device wirelessly, and receive the device characteristics wirelessly.

Identifying the at least one proximately located load device may also be done via Bar Code reading. Identifying the at least one proximately located load device may further use beamforming to better communicate with the proximately located load device.

Device characteristics may include load consumption characteristics, usage frequency characteristics, make/model number of the load device, registration information for the load device, service information for the load device, status of the load device, and/or various other characteristics of the load device.

Figure 4:
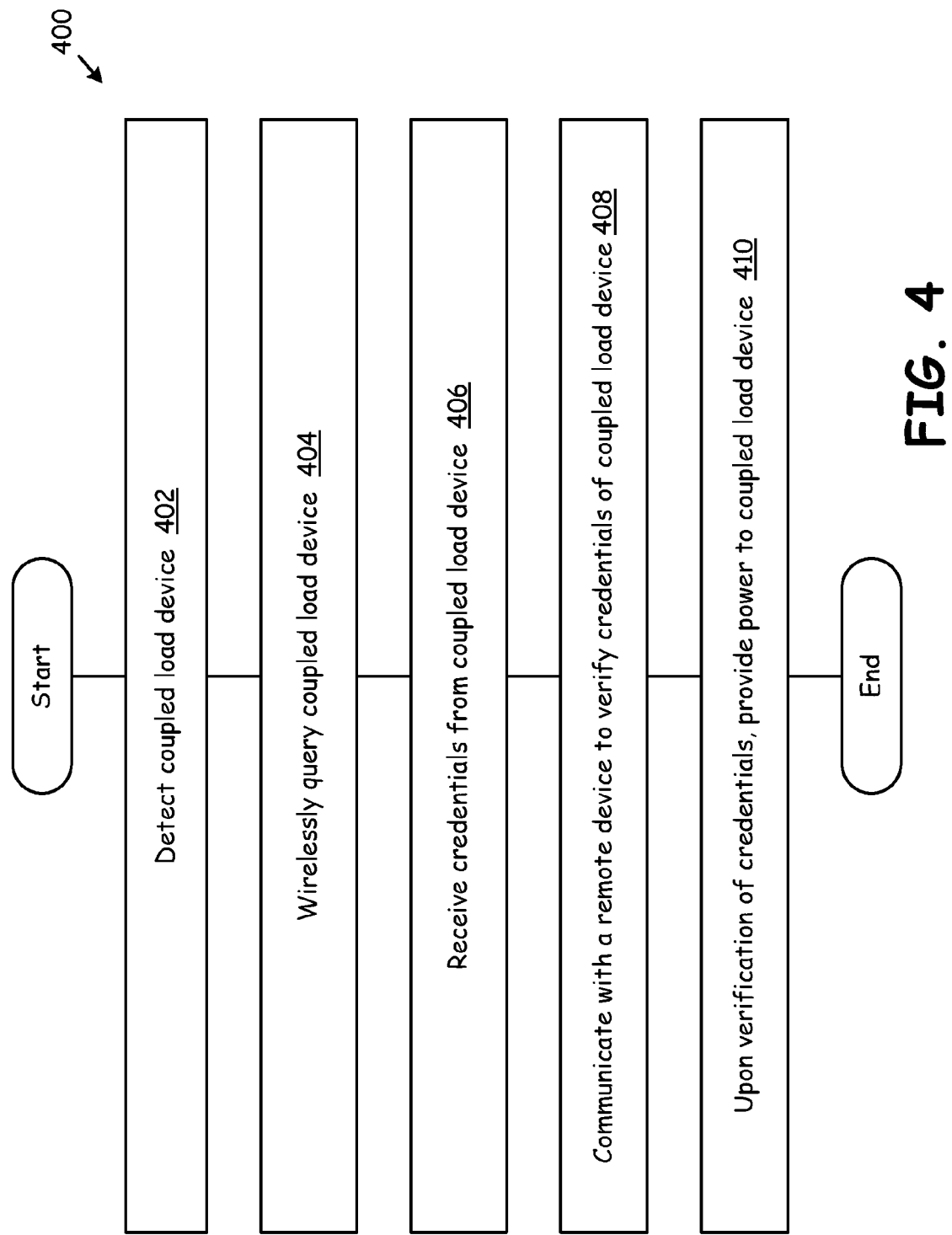
FIG. 4 is a flow chart illustrating operations according to another aspect of the present invention for operating a PLC device to service a coupled load device.

FIG. 4 is a flow chart illustrating operations according to another aspect of the present invention for operating a PLC device to service a coupled load device. The operations 400 of FIG. 4 may be performed by any of the various PLC devices illustrated in FIG. 1. Further, the PLC device performing the operations 400 of FIG. 4 may have the structure, or similar structure to the PLC device 200 illustrated in FIG. 2. The operations 400 of FIG. 4 begin with a Power Line Communications (PLC) device detecting a coupled load device, e.g., via power feed I/F 209 (Step 402). Operations 400 continue with the PLC device wirelessly querying the coupled load device (Step 404). Then, the PLC device wirelessly receives credentials from the coupled load device (Step 406). Operations continue with the PLC device communicating with a remote PLC (or other) device to verify the credentials of the coupled load device (Step 408). Operations conclude with the PLC device, upon verifying the credentials of the coupled load device, providing power to the coupled load device (Step 410).

Figure 5:
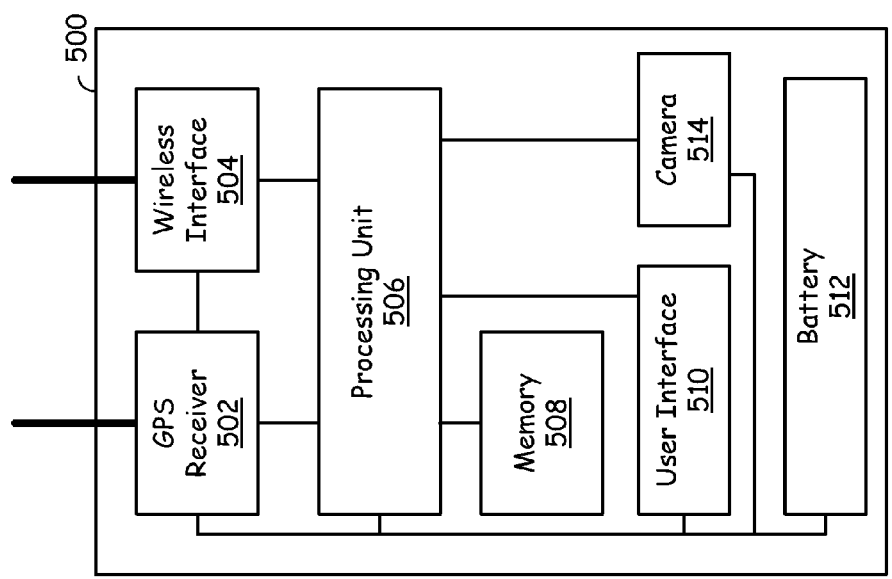
FIG. 5 is a block diagram illustrating a portable electronic device constructed according to the present invention.

FIG. 5 is a block diagram illustrating a portable electronic device constructed according to the present invention. The portable electronic device 500 includes a GPS receiver 502, a wireless interface 504, a processing unit 506, memory 508, user interface 510, and a battery 512. The components of the portable electronic device 500 are typically contained within a hard case that provides protection from the elements. The wireless interface 504 will have particular structure and functionality based upon the type of the portable electronic device 500. For example, when the portable electronic device 500 is a cellular telephone, the wireless interface 504 will support a corresponding interface standard e.g., GSM, GPRS, EDGE, UMTS, 1xRTT, 1xEV-DO, 1xEV-DV, LTE, etc. The wireless interface 504 of the cellular telephone 504 may also/alternately support WWAN, WLAN, and/or WPAN functionality. When the portable electronic device is a WLAN terminal for example, the wireless interface 504 will support standardized communication according to the IEEE 802.11x group of standards, for example. When the portable electronic device is a WPAN device, the wireless interface 504 supports the Bluetooth interface standard or another WPAN standard. In any case, the wireless interface 504 may support all or a subset of cellular telephone, WLAN, and WPAN operations.

The processing unit 506 may include any type of processor such as a microprocessor, a digital signal processor, an Application Specific Integrated Circuit (ASIC), or a combination of processing type devices. The processing unit 506 is operable to execute a plurality of software instructions that are stored in memory 508 and downloaded for execution. The processing unit 506 may also include specialized hardware required to implement particular aspects of the present invention. Memory 508 may include SRAM, DRAM, PROM, flash RAM, or any other type of memory capable of storing data and instructions.

A user interface 510 may include a microphone, a speaker, a keypad, a screen, a touch screen, a light, a voice recognition system, an optical recognition system that would authenticate a user's iris, for example, and/or any other type of interface that may be employed in the portable electronic device. In some embodiments, the user interface 510 may include therewith ability to service a headset including microphone and earpiece for the user. The wireless device 500 is operable to support the operations described further with reference to FIGS. 6-15.

FIG. 6 is a flowchart illustrating operations for creating a diagrammatic representation of a premises according to one or more embodiments of the present invention. The operations 600 of FIG. 6 commence with the wireless device receiving premises modeling input from a user via the user interface (step 602). Operations continue with the wireless device, based upon the modeling input, establishing a diagrammatic representation of a premises, the diagrammatic representation representing a plurality of areas and passages between the plurality of areas (Step 604). Then, for each area of the plurality of areas (Step 606), operations include: directing the user, via the user input, to put the wireless device into the area (step 608), receiving input from the user via the user input to indicate that the wireless device is in the area (Step 610), and measuring wireless reception quality based upon a wireless signal transmitted by a wireless access point for the area (Step 612). Operations 600 conclude with altering the diagrammatic representation to indicate wireless reception quality for each of the plurality of spaces (Step 614).

The method 600 may further include modifying the size of diagrammatic representation of spaces based upon user input. Further, the operations 600 may further include uploading data corresponding to the diagrammatic representation to a premises device. The operations 600 may further include receiving data via the user device to identify a load device within a respective space and reporting data regarding the load device and the respective space to a premises device. Moreover, operations 600 may include identifying a space requiring improved wireless reception quality and directing the user via the user interface to install a Powerline Communication/wireless bridge in the identified space.

Figure 7A:
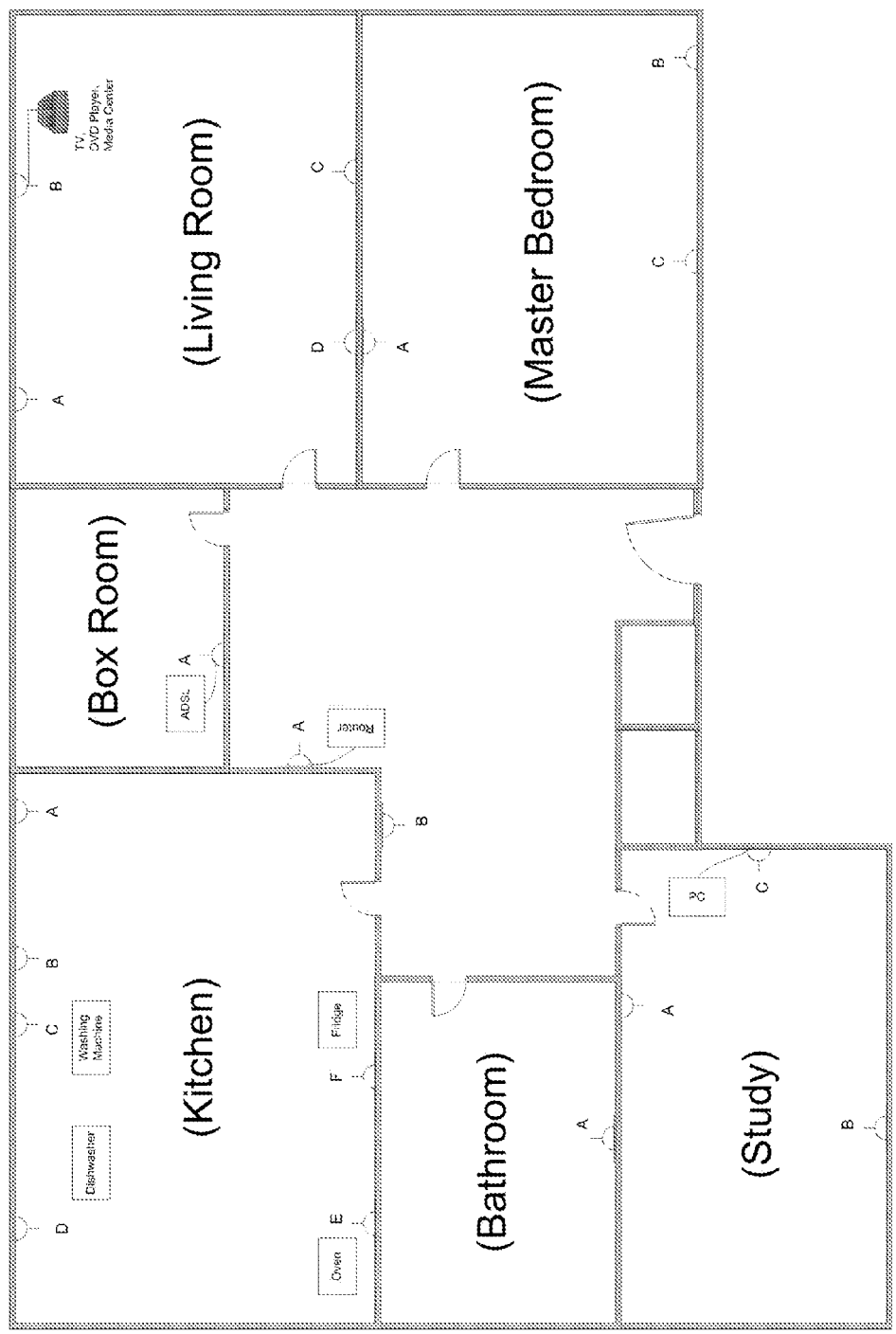
FIG. 7A is a physical map of a premises that is modeled according to one or more embodiments of the present invention.

FIG. 7A is a physical map of a premises that is modeled according to one or more embodiments of the present invention. As a shown in FIG. 7A, there are the plurality of rooms within the premises. A landing has eight doors and an external door. Doors from the landing open to a study, a bathroom, a kitchen, a box room, a living room, and a master bedroom. FIG. 7A illustrates a scale replica of the premises. However, creating such a scale replica from the actual premises is difficult and tedious and requires the use of tools such as measuring tapes or other devices.

Figure 7B:
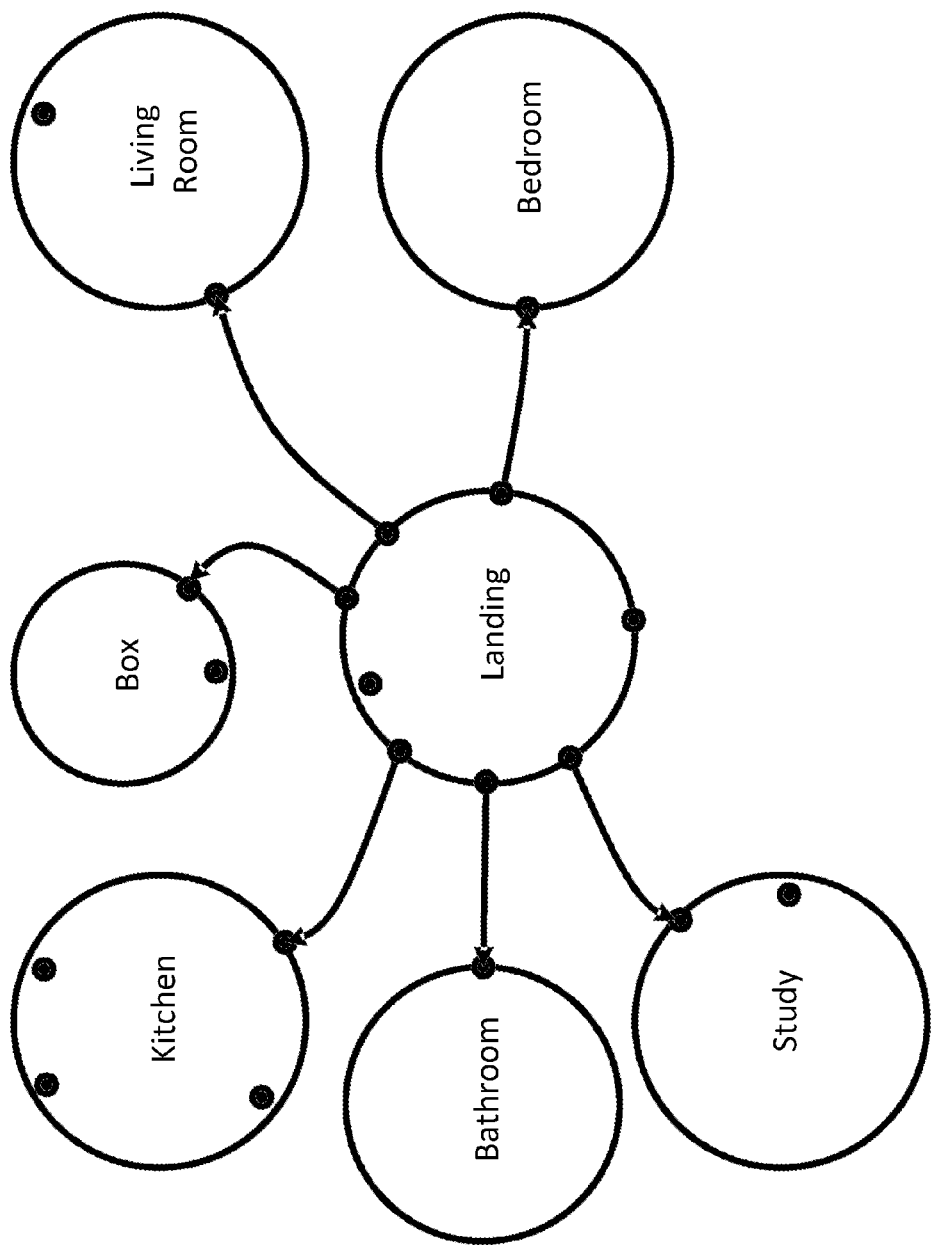
FIG. 7B is a diagrammatic representation of the premises of FIG. 7A created according to one or more embodiments of the present invention.

FIG. 7B is a diagrammatic representation of the premises of FIG. 7A created according to one or more embodiments of the present invention. The diagrammatic representation of FIG. 7A corresponds to the premises of FIG. 7A. As is shown, each of the rooms of the premises is represented by a circle and each of the doors is represented by arrows that extend from linked rooms. The diagrammatic representation of FIG. 7B was created by a user using a smart phone that embodies the method 600 of FIG. 6. An example of how this diagrammatic representation is constructed for the premises is described further with reference to FIGS. 8-15.

FIG. 8 is a block diagram illustrating operations for creating a diagrammatic representation of a premises according to one or more embodiments of the present invention. As a shown in FIG. 8, the operations 600 previously described with reference to FIG. 6 includes a plurality of phases. A first phase of these operations corresponds to capturing a diagrammatical representation of the premises. Phase one has three sub-stages, which include steps for capturing a simple map of the premises using the interface of the smart phone. The operations of phase one would typically take approximately 10 to 15 minutes to complete, depending upon the size of the premises in the relative sophistication of the user.

Phase two of the operations include additional operations to characterize the premises after the diagrammatic representation is completed. For example, after the diagrammatic map is complete, wireless service quality, e.g., WLAN service quality, WPAN service quality, 60 GHz service quality, NFC service quality, etc. may be measured by the smart phone in each room, based upon the smart phone directing the user to take the smart phone into a particular room and indicating when the smart phone is in the room. With these characteristics captured, the diagrammatic representation is altered to represent such wireless coverage quality. Further, stage two may include the user including in the model devices serviced within the premises.

Phase three of the operations include moving all captured information from the smart phone to a smart router such as the PLC router illustrated at 124 of FIG. 1. Once a user upgrades to a servicing router/smart router, the information captured on the smart phone may be transferred from the smart phone to the smart router using WLAN communications or other communications. The user may then use the smart router to manage communications within the premises. Further, phase three may further include operations suggesting the placement of additional wireless resources such additional PLC/WLAN bridges or other devices.

FIGS. 9-15 are diagrams illustrating a display of a portable electronic device during creation and modification of a diagrammatic representation of a premises according to one or more embodiments of the present invention.

Figure 9:
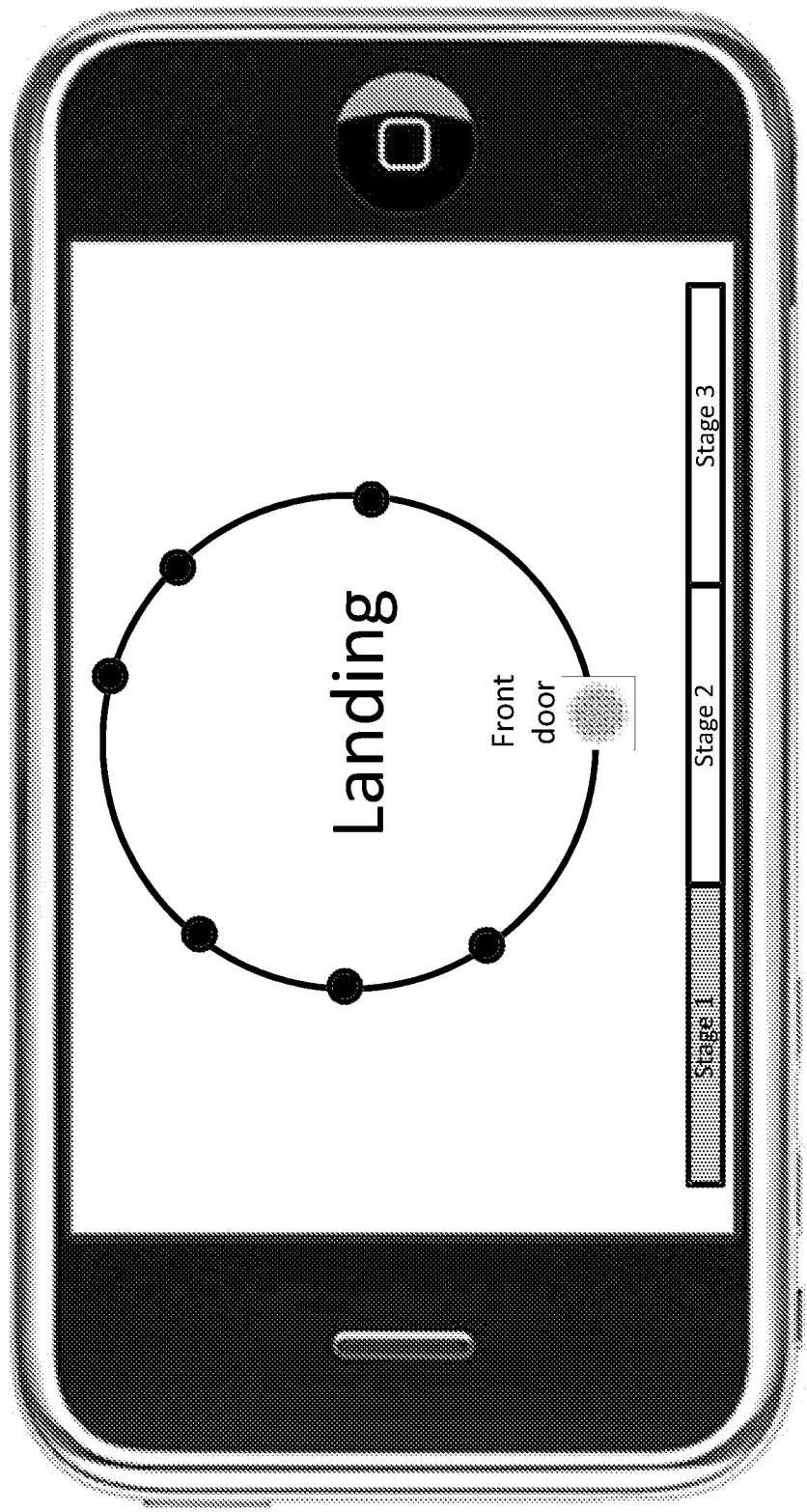
FIGS. 9-15 are diagrams illustrating a display of a portable electronic device during creation and modification of a diagrammatic representation of a premises according to one or more embodiments of the present invention.

Referring particularly to FIG. 9, an application operating according to one or more embodiments of the present invention allows a user to construct a diagrammatic representation of a modeled premises. Such modeling commences with establishing a base space, e.g., landing within the premises. With the base space established, the user may enter relative locations of doors upon the perimeter of the base space. Such operations are part of phase one.

Figure 10:
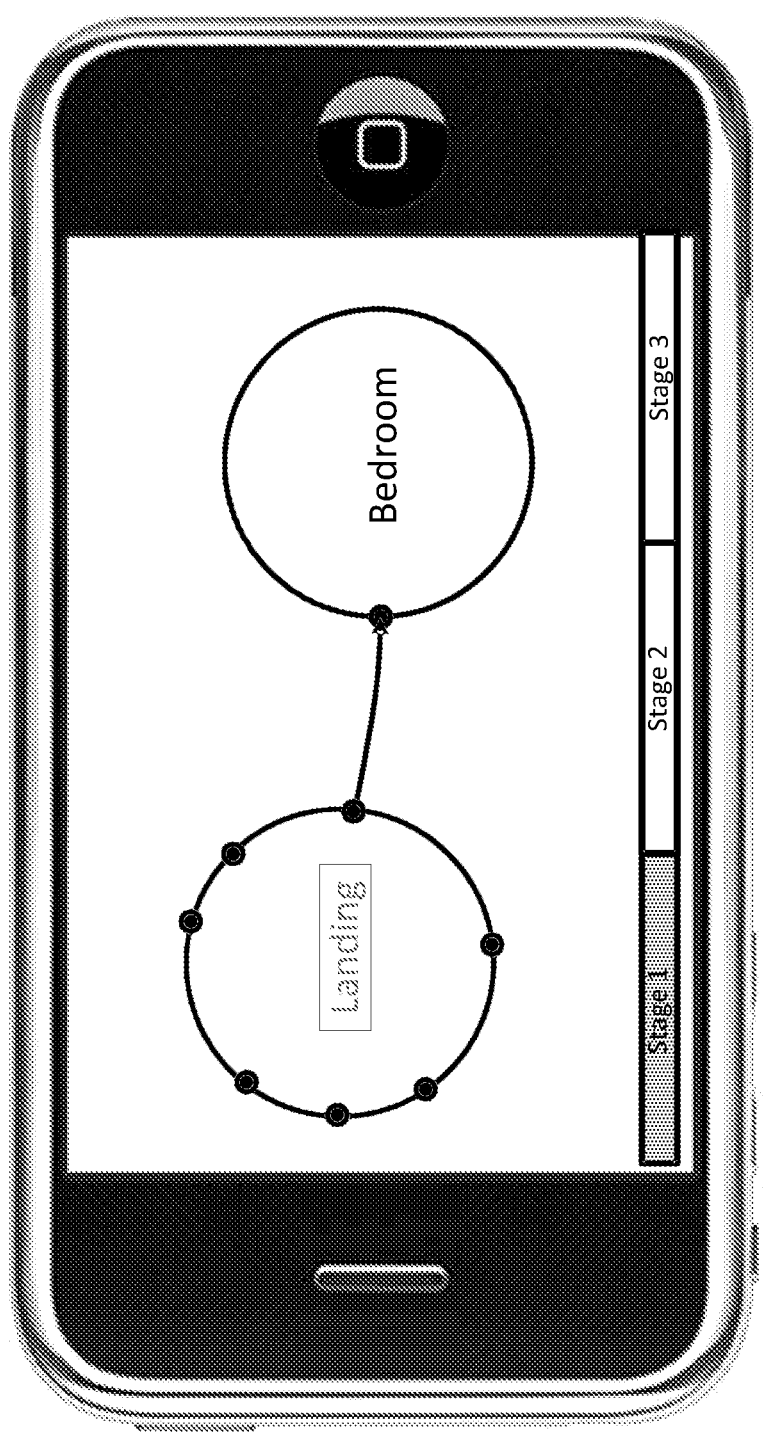

Referring now to FIG. 10, based upon user input, the smart phone creates a representation of a bedroom and its relative location to the landing.

Figure 11:
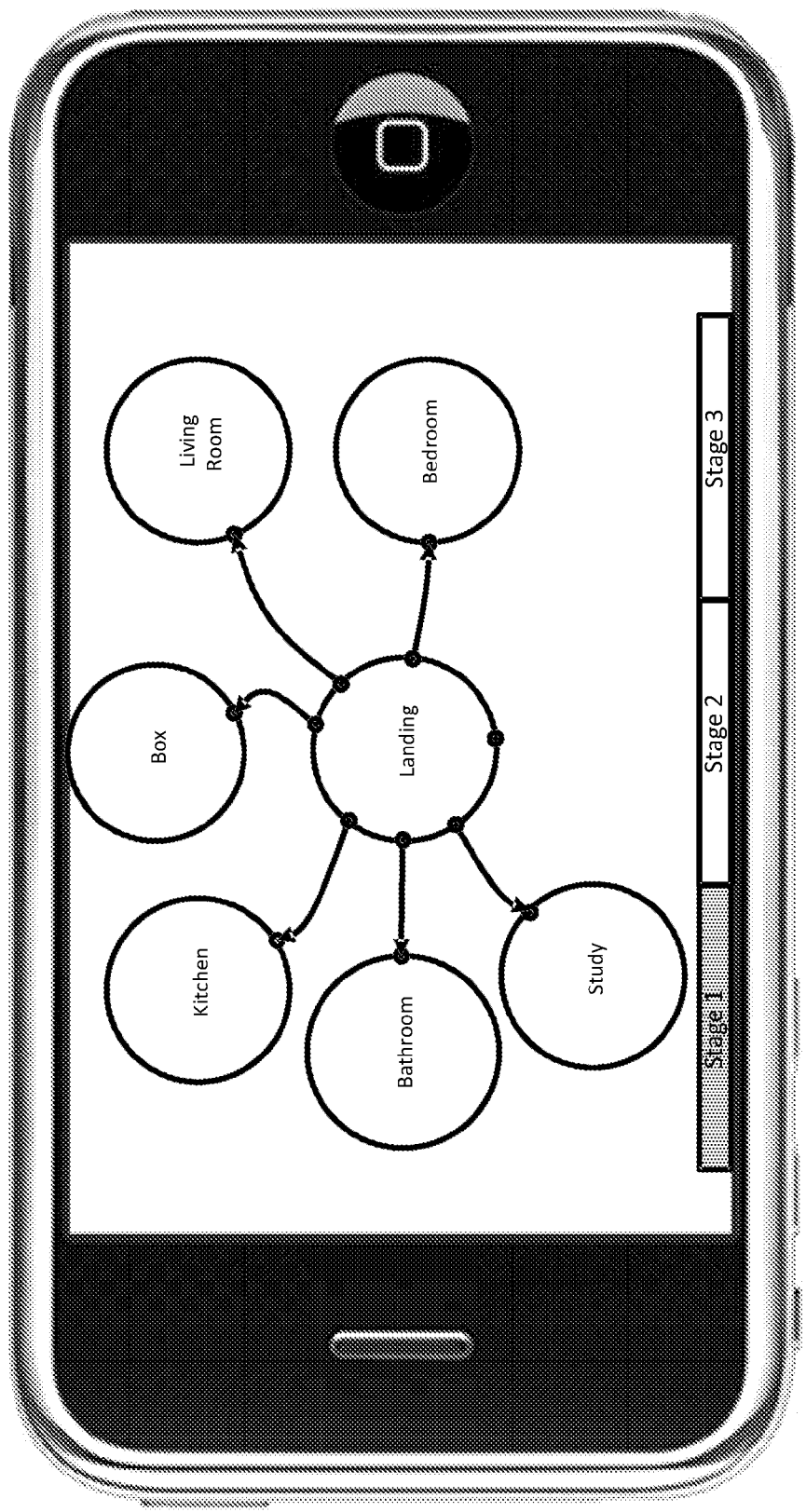

Referring now to FIG. 11, based upon user input, the smart phone has created a representation of all rooms in the premises with arrows representing how the rooms logically couple to the landing. Note that the representation is only logical, and does not provide a spatial relationship among the spaces. Operations according to the present invention allow the relative positions of the spaces of the model to be moved with respect to one another, for the size of the spaces to be altered, and various other basic operations.

Figure 12:
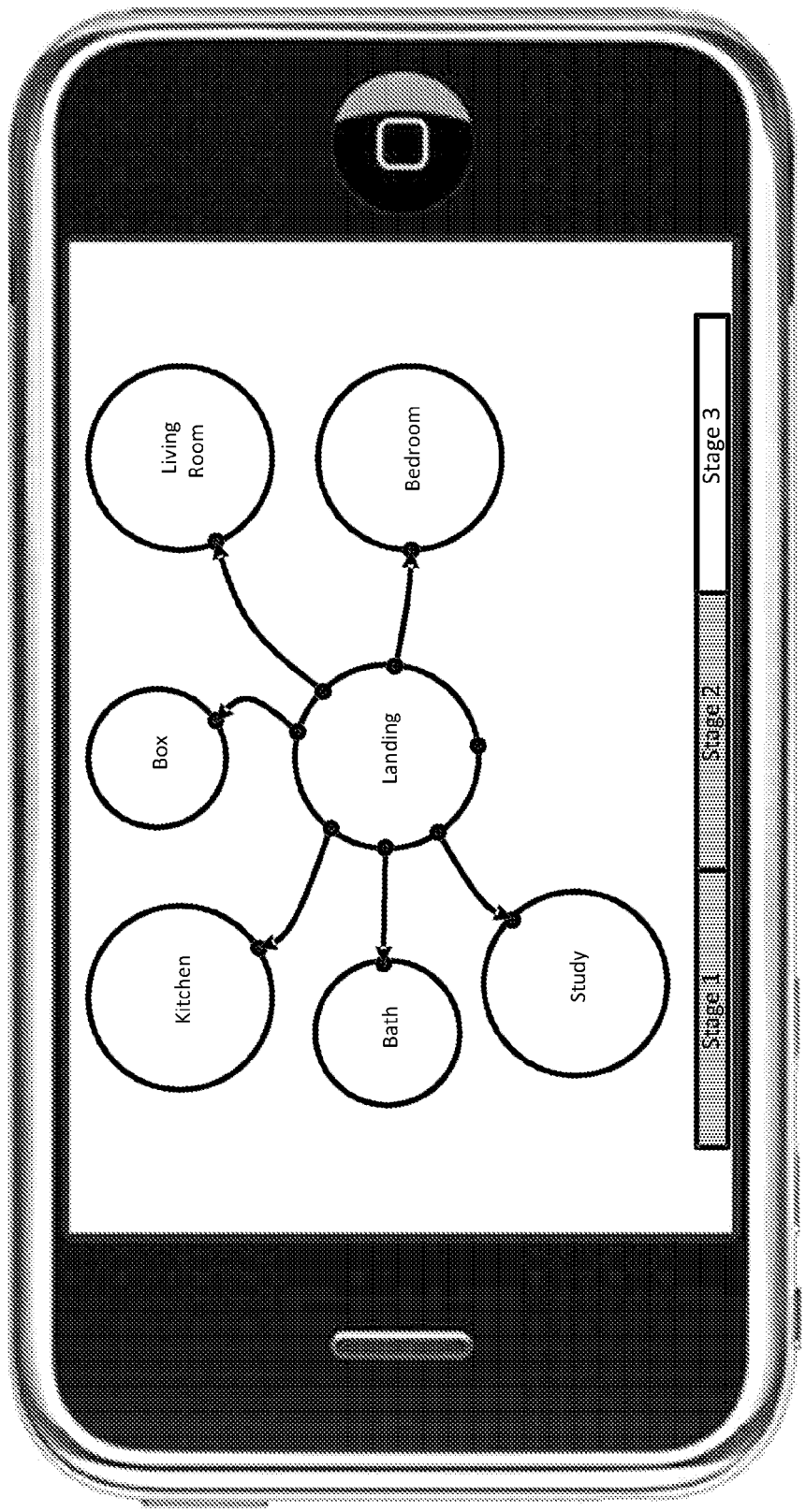
Figure 13:
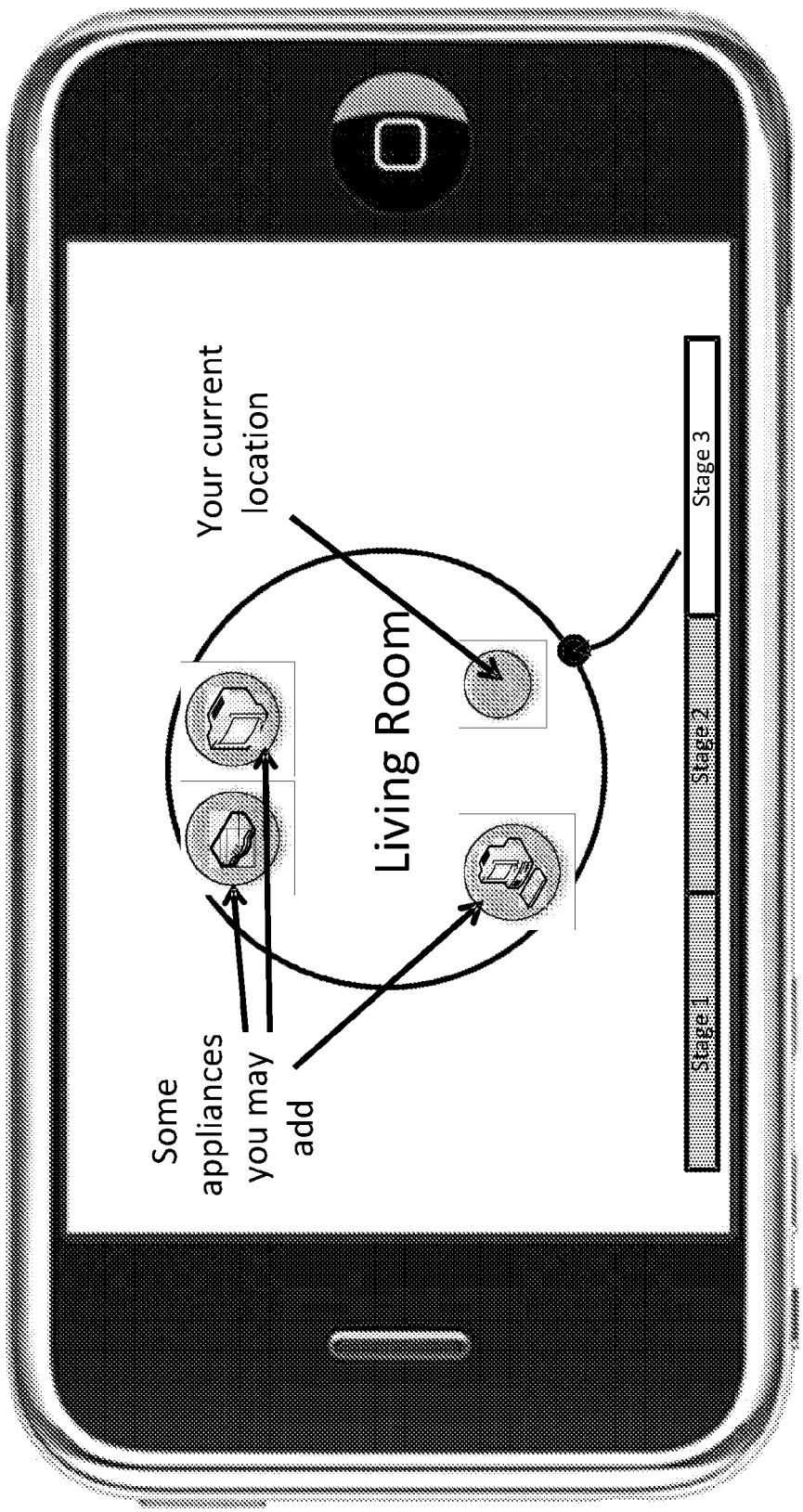

Referring now to FIG. 12, stage two operations include indicating further details regarding the rooms. As shown in FIG. 13, stage two operations include adding appliance icons within the living room. The operations for adding these appliances may include communications between the smart phone and the devices via WLAN, WPAN, 60 GHz, etc. or via bar code reading, RF tag reading, NFC reading by the smart phone. Alternately, adding these appliances may be done by the user via the user interface of the smart phone.

Figure 14:
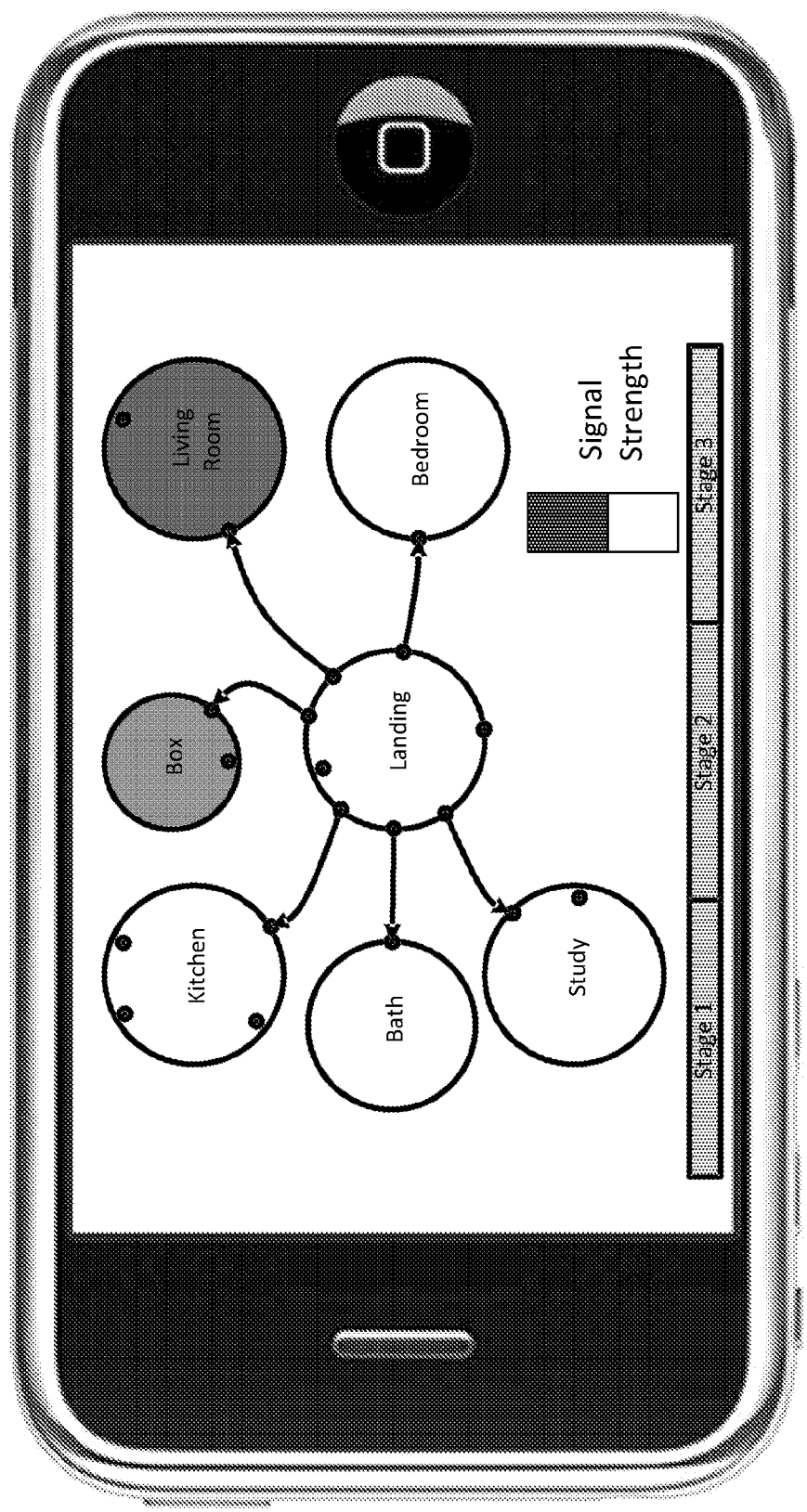

Referring now to FIG. 14, stage two operations may include the smart phone directing the user to each of the plurality of modeled rooms and characterizing wireless signal quality within the rooms. As illustrated, the box room and the living room have higher signal quality than the other rooms. Stage three operations may include transferring this data to a smart router, directing the user to place a PLC/WLAN bridge in the study, or other operations relating to the wireless coverage.

Figure 15:
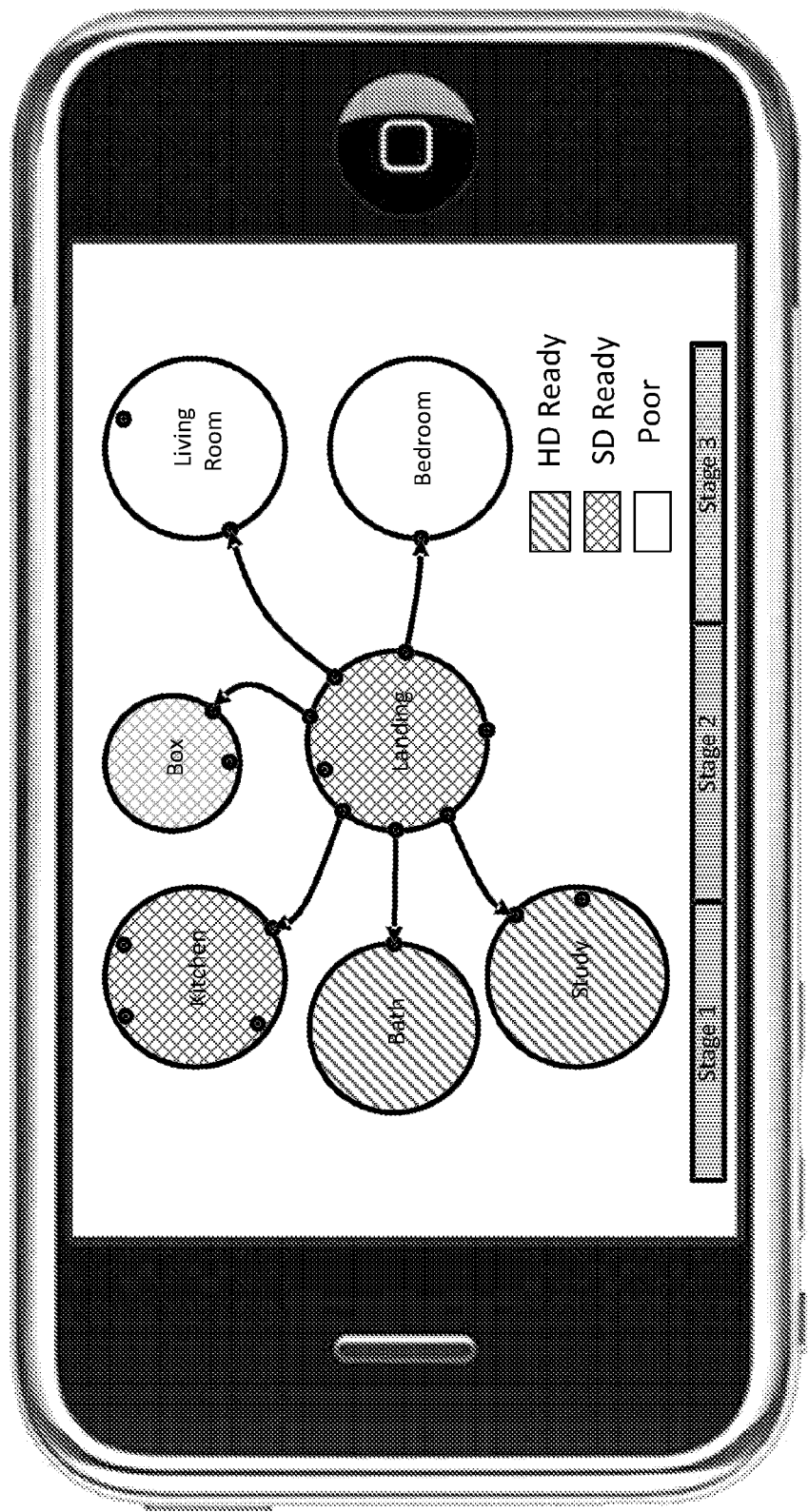

Referring now to FIG. 15, stage two operations may include the smart phone directing the user to each of the plurality of modeled rooms and characterizing wireless signal quality within the rooms to determine the rate at which data may be transmitted. As illustrated, the bath room and the study are able to support HD video, the kitchen, landing, and box room are able to support SD video, and the living room and bedroom have poor signal quality and cannot support streaming video. Stage three operations may include transferring this data to a smart router, directing the user to place a PLC/WLAN bridge in the study, or other operations relating to the wireless coverage.

Circuitry described herein that performs particular functions may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions, which may be considered singularly or in combination a "processing module." The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributed located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry including the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the FIGs. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

The invention claimed is:

1. A Power Line Communications (PLC) device comprising:
    a processing module;
    memory coupled to the processing module;
    a PLC interface coupled to the processing module; and
    a wireless interface coupled to the processing module, wherein the processing module, the PLC interface, and the wireless interface are operable to:
        identify at least one proximately located load device using the wireless interface by using beamforming to direct wireless communications toward the proximately located load device;
        determine device characteristics of the at least one proximately located device using the wireless interface;
        communicate with a second PLC device via the PLC interface; and
        transmit to the second PLC device via the PLC interface the device characteristics of the at least one proximately located device.

2. The PLC device of claim 1, identifying the at least one proximately located load device using the wireless interface by:
    RF tag reading;
    Near Field Communications (NFCs); and
    Wireless Personal Area Network (WPAN) communications.

3. The PLC device of claim 1, wherein determining device characteristics of the at least one proximately located device using the wireless interface comprises:
    establishing wireless communications with the at least one proximately located device;
    querying the at least one proximately located device wirelessly; and
    receiving the device characteristics wirelessly.

4. The PLC device of claim 1, wherein identifying the at least one proximately located load device is done via Bar Code reading.

5. The PLC device of claim 1, wherein the device characteristics comprise load consumption characteristics of the at least one proximately located device.

6. The PLC device of claim 1:
    further comprising a metered power charging feed;
    wherein the processing module, the PLC interface, and the wireless interface are operable to:
        verify credentials of a load device coupled to the power charging fee using the wireless interface; and
        provide power to the load device based upon the credentials.

7. A method for operating a Power Line Communications (PLC) device having a processing module, a PLC interface, and a wireless interface, the method comprising:
    identifying at least one proximately located load device using the wireless interface;
    determining device characteristics of the at least one proximately located load device using the wireless interface using beamforming to direct wireless communications toward the proximately located load device;

communicating with a remote PLC device via the PLC interface; and transmitting to the remote PLC device via the PLC interface the device characteristics of the at least one proximately located load device.

8. The method of claim 7, wherein identifying the at least one proximately located load device using the wireless interface comprising at least one of:

RF tag reading an RF tag of the at least one proximately located load device;

using Near Field Communications (NFCs) to communicate with the at least one proximately located load device; and using Wireless Personal Area Network (WPAN) communications to communicate with the at least one proximately located load device.

9. The method of claim 7, wherein determining device characteristics of the at least one proximately located device using the wireless interface comprises:

establishing wireless communications with the at least one proximately located device;

querying the at least one proximately located device wirelessly; and receiving the device characteristics wirelessly.

10. The method of claim 7, wherein identifying the at least one proximately located load device is done via Bar Code reading.

11. The method of claim 7, wherein the device characteristics comprise load consumption characteristics of the at least one proximately located device.

12. The method of claim 7, further comprising:

verify credentials of a coupled load device using the wireless interface; and providing power to the load device based upon the credentials.

13. A method for operating a wireless device having a wireless interface and a user interface, the method comprising:

receiving premises modeling input from a user via the user interface;

based upon the modeling input, establishing a diagrammatic representation of a premises, the diagrammatic representation representing a plurality of areas and passages between the plurality of areas;

for each area of the plurality of areas:

directing the user, via the user input, to put the wireless device into the area;

receiving input from the user via the user input to indicate that the wireless device is in the area; and measuring wireless reception quality based upon a wireless signal transmitted by a wireless access point for the area; and altering the diagrammatic representation to indicate wireless reception quality for each of the plurality of spaces.

14. The method of claim 13, further comprising modifying size diagrammatic representation of a space based upon user input.

15. The method of claim 13, further comprising uploading data corresponding to the diagrammatic representation to a premises device.

16. The method of claim 13, further comprising:

receiving data via the user device to identify a load device within a respective space; and reporting data regarding the load device and the respective space to a premises device.

17. The method of claim 13, further comprising:

identifying a space requiring improved wireless reception quality; and directing the user via the user interface to install a Powerline Communication/wireless bridge in the identified space.

18. The method of claim 13, wherein the operations are embodied on a hand-held device application.

19. The method of claim 13, further comprising altering operation of at least one wireless device based on the indicated wireless reception quality.

20. The method of claim 13, further comprising altering operation of at least one Powerline Communication/wireless bridge based on the indicated wireless reception quality.

* * * * *